United States Patent
Mizuno et al.

(10) Patent No.: US 6,486,083 B1
(45) Date of Patent: Nov. 26, 2002

(54) SEMICONDUCTOR DEVICE MANUFACTURING METHOD AND SEMICONDUCTOR MANUFACTURING APPARATUS

(75) Inventors: Norikazu Mizuno; Kiyohiko Maeda, both of Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/675,192

(22) Filed: Sep. 29, 2000

(30) Foreign Application Priority Data

Feb. 15, 2000 (JP) .......................................... 2000-037120

(51) Int. Cl.⁷ .......................... H01L 21/31; H01L 21/469
(52) U.S. Cl. .......................... 438/794; 438/786; 438/791; 427/255.28; 427/255.394
(58) Field of Search ................................. 438/778, 786, 438/791, 794; 427/99, 255.18, 255.28, 255.394

(56) References Cited

U.S. PATENT DOCUMENTS

| | | |
|---|---|---|
| 4,232,063 A | * 11/1980 | Rosler et al. ................... 427/94 |
| 5,874,368 A | * 2/1999 | Laxman et al. ............. 438/794 |
| 5,976,991 A | * 11/1999 | Laxman et al. ............. 438/786 |

FOREIGN PATENT DOCUMENTS

| | | |
|---|---|---|
| JP | 06-132284 | 5/1994 |
| JP | 06-310443 | 11/1994 |
| JP | 7-21570 | 5/1995 |

* cited by examiner

*Primary Examiner*—Alexander Ghyka
(74) *Attorney, Agent, or Firm*—Hogan & Hartson, LLP

(57) ABSTRACT

A semiconductor device manufacturing method including a step of forming, by thermal chemical vapor deposition, silicon nitride films on a plurality of substrates vertically stacked in a vertical reaction tube having an inner wall. Bis tertiary butyl amino silane and $NH_3$ flows into the vertical reaction tube and flows vertically from one end of the plurality of substrates to an opposing end of the plurality of substrates without flowing into the vertical reaction tube through the inner wall at a height between the one end and the opposing end of the plurality of substrates. The silicon nitride films are formed on the plurality of substrates in a state in which a distance "a" between adjacent substrates of the plurality of substrates and a distance "b" between edges of the plurality of substrates and the inner wall of the vertical reaction tube are maintained substantially equal to each other.

18 Claims, 6 Drawing Sheets

SEMICONDUCTOR DEVICE MANUFACTURING METHOD AND SEMICONDUCTOR MANUFACTURING APPARATUS

BACKGROUND OF THE INVENTION

1. Field of the Invention

The present invention relates to a semiconductor device manufacturing method and a semiconductor manufacturing apparatus, and more particularly, to a semiconductor device manufacturing method including a silicon nitride film manufacturing step using a thermal CVD (Chemical Vapor Deposition) method or a silicon oxynitride film manufacturing step using a thermal CVD method, and to a semiconductor manufacturing apparatus preferably used for the method.

2. Description of the Related Art

Conventionally, it is common that a silicon nitride film used in a semiconductor device is formed using mixed gas of $SiH_2Cl_2$ (DCS, hereinafter) and $NH_3$ and that a silicon oxynitride film used in a semiconductor device is formed using mixed gas of DCS, $NH_3$ and $N_2O$.

According to this method, however, it is necessary to form the silicon nitride film at a temperature as high as 700° C. to 800° C. and as a result, there is a problem that impurities are adversely diffused deeply into a shallow diffused layer and a semiconductor device element can not be formed small in size. Further, there is a problem that $NH_4Cl$ (ammonium chloride), which is a by-product of reaction, adheres to a discharge port, this $NH_4Cl$ generates rust on a metal surface, and metal contamination is generated on a semiconductor wafer.

SUMMARY OF THE INVENTION

To solve the problems, the present inventors examined forming a silicon nitride (Si3N4) film using $NH_3$ and $SiH_2(NH(C_4H_9))_2$(bis tertiary butyl amino silane: BTBAS, hereinafter) as raw gases and forming a silicon oxynitride (SiON) film using BTBAS, $NH_3$ and $N_2O$ as raw gases. As a result, the inventors have found that the silicon nitride film and the silicon oxynitride film can be formed at a low temperature of about 600° C. and $NH_4Cl$, which is a cause of metal contamination, is not generated.

The present inventors, however, have found that when a silicon nitride film or a silicon oxynitride film is formed using BTBAS, uniformity in thickness of the formed film over the entire surface of the substrate is not sufficient.

Figure 1:
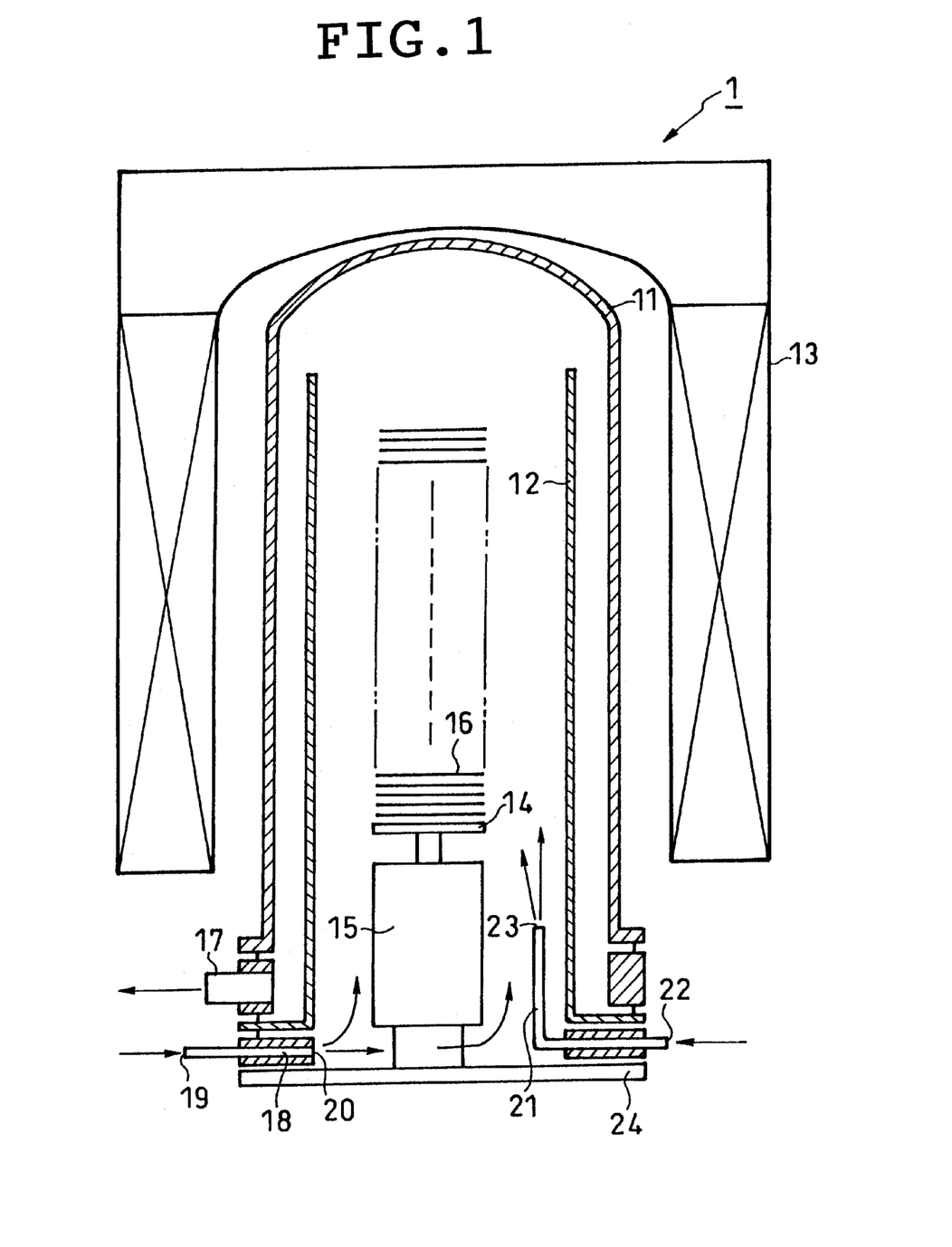
FIG. 1 is a schematic sectional view for explaining a vertical-type LPCVD film forming apparatus used in one embodiment of the present invention.

FIG. 1 shows a structure of a furnace used when a silicon nitride film is formed using BTBAS and $NH_3$ as raw gases, and when a silicon oxynitride film is formed using BTBAS, $NH_3$ and $N_2O$ as raw gases.

A case in which the silicon nitride film is formed using BTBAS and $NH_3$ as raw gases will be explained as one example.

A quartz reaction tube (outer tube) 11 is located outside, and a cylindrical quartz inner tube 12 is disposed inside of the quartz reaction tube 11. A quartz boat 14 is disposed inside of the quartz inner tube 12. The quartz boat 14 supports a large number of semiconductor wafers 16.

BTBAS and $NH_3$ are introduced into a furnace through quartz nozzles 21 and 18, respectively. The gases are first introduced into the quartz inner tube 12 and flow from below upward. The gases are discharged out from the quartz inner tube 12 from above downward.

BTBAS and $NH_3$ decomposed by heat during this process forming $Si_3N_4$ on the semiconductor wafer 16 and a quartz surface.

Figure 4A:
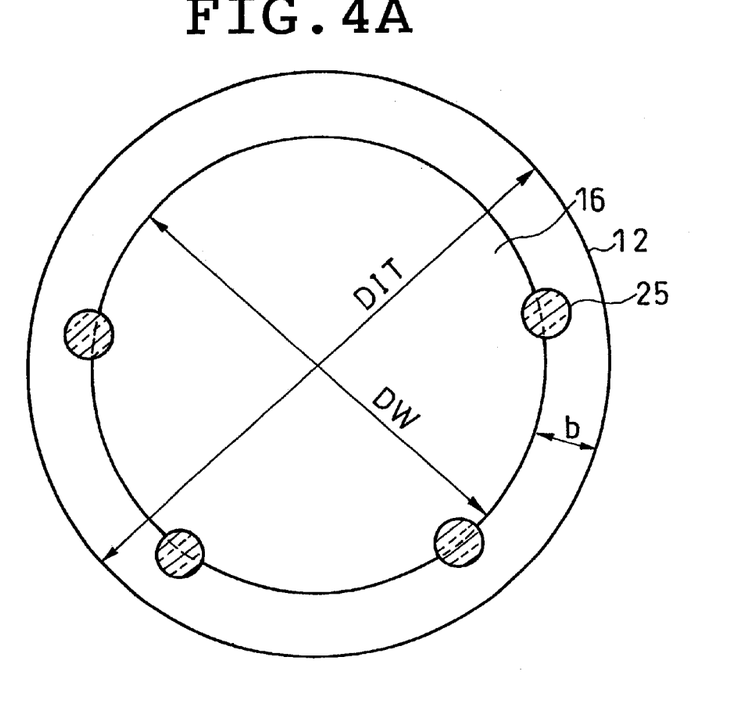
FIG. 4A is a schematic transversal sectional view and FIG. 4B is a schematic longitudinal sectional view.
Figure 4B:
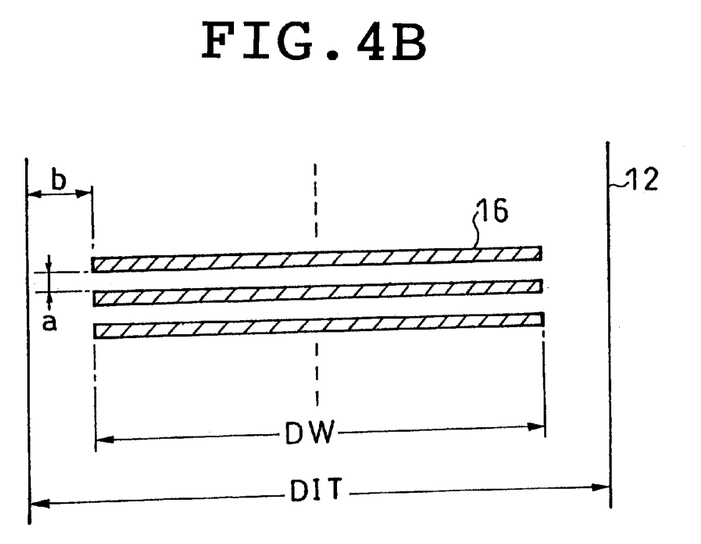

FIG. 4A shows a schematic transversal sectional view of the quartz inner tube 12 and its interior, and FIG. 4B is a schematic longitudinal sectional view thereof.

The present inventors first formed a silicon nitride film using BTBAS and $NH_3$ as raw gases having the same compositions as those used for other raw gases.

The plurality of semiconductor wafers 16 each having a diameter of 200 mm were stacked by boat columns 25 in the vertical direction in the quartz inner tube 12 having an inner diameter of 260 mm, and films were formed. A distance "b" between edges of the semiconductor wafers 16 and an inner wall of the quartz inner tube 12 was 30 mm. A distance "a" between the adjacent semiconductor wafers 16 was 6.35 mm.

As a result, a thickness of the $Si_3N_4$ film was thin around a peripheral portion of the wafer, and the film at the central portion of the wafer was thin and reentrant in shape. When the silicon oxynitride film was formed using BTBAS, $NH_3$, and $N_2O$ as raw gases, the same result was obtained.

Thereupon, the present invention provides a semiconductor device manufacturing method and a semiconductor manufacturing apparatus in which when a silicon nitride film is formed using BTBAS and $NH_3$ as raw gases, and when a silicon oxynitride film is formed using BTBAS, $NH_3$ and $N_2O$ as raw gases, the uniformity in thickness of the formed film over the entire surface of the substrate can be enhanced.

The present inventors have considered that at the center portion of a semiconductor wafer 16, because other semiconductor wafers 16 are located below and above the semiconductor wafer, space in the vicinity of the semiconductor wafer is small, but at the peripheral portion of the semiconductor wafer, a large space exists between the semiconductor wafer and the quartz inner tube 12, and therefore, the film formed on the semiconductor wafer is thick at the peripheral portion of the semiconductor wafer and is thin and reentrant in shape at the central portion of the semiconductor wafer. Following the above-mentioned consideration, the present inventors have studied a relation of relative values between the distance "a" between the adjacent semiconductor wafers 16 and the distance "b" between the edge of the semiconductor wafer 16 and the quartz inner tube 12, to distribution of a thickness of a film formed on the semiconductor wafer 16 over the entire surface of the wafer 16, and as a result, the present inventors have reached the present invention.

According to a first aspect of the present invention, there is provided a semiconductor device manufacturing method, including:

a step of forming, by thermal chemical vapor deposition, silicon nitride films on a plurality of substrates vertically stacked in a vertical reaction tube having an inner wall, with bis tertiary butyl amino silane and $NH_3$ flowing into the vertical reaction tube and flowing vertically from one end of said plurality of substrates to an opposing end of said plurality of substrates and not flowing into said vertical reaction tube through said inner wall at a height between said one end and said opposing end of said plurality of substrates, wherein the silicon nitride films are formed on the plurality of substrates in a state in which a distance "a" between adjacent substrates of the plurality of substrates and a distance "b" between edges of the plurality of substrates and the inner wall of the vertical reaction tube are maintained substantially equal to each other.

Preferably, a value of a ratio "b/a", which is a ratio of the distance "b" between the edges of the plurality of substrates and the inner wall of the vertical reaction tube to the distance "a" between the adjacent substrates, is set to be in a range of 0.5 to 1.1, and the silicon nitride films are formed on the plurality of substrates in this state.

Preferably, the substrates are semiconductor wafers, and more preferably, the substrates are semiconductor silicon wafers.

According to a second aspect of the present invention, there is provided a semiconductor device manufacturing method, including:

a step of forming, by thermal chemical vapor deposition, silicon oxynitride films on a plurality of substrates vertically stacked in a vertical reaction tube having an inner wall, with bis tertiary butyl amino silane, $NH_3$, and $N_2O$ flowing into the vertical reaction tube and flowing from one end of said plurality of substrates to an opposing end of said plurality of substrates and not flowing into said vertical reaction tube through said inner wall at a height between said one end and said opposing end of said plurality of substrates, wherein the silicon oxynitride films are formed on the plurality of substrates in a state in which a distance "a" between adjacent substrates of the plurality of substrates and a distance "b" between edges of the plurality of substrates and the inner wall of the vertical reaction tube are maintained substantially equal to each other.

Preferably, a value of a ratio "b/a", which is a ratio of the distance "b" between the edges of the plurality substrates and the inner wall of the vertical reaction tube to the distance "a" between the adjacent substrates, is set to be in a range of 0.5 to 1.1, and the silicon oxynitride films are formed on the plurality of substrates in this state.

Preferably, the substrates are semiconductor wafers, and more preferably, the substrates are semiconductor silicon wafers.

According to a third aspect of the present invention, there is provided a semiconductor device manufacturing method including:

a step of forming, by thermal chemical vapor deposition, silicon nitride films on a plurality of substrates stacked on a boat having a boat column with bis tertiary butyl amino silane and $NH_3$ flowing into a reaction tube accommodating the plurality of substrates, wherein the reaction tube is provided, at a position corresponding to the boat column, with a boat column groove for accepting the boat column.

According to a fourth aspect of the present invention, there is provided a semiconductor device manufacturing method including:

a step of forming, by thermal chemical vapor deposition, silicon oxynitride films on a plurality of substrates stacked on a boat having a boat column with bis tertiary butyl amino silane, $NH_3$, and $N_2O$ flowing into a reaction tube accommodating said plurality of substrates, wherein
said reaction tube is provided, at a position corresponding to said boat column, with a boat column groove for accepting said boat column.

BRIEF DESCRIPTION OF THE DRAWINGS

The above and further objects, features and advantages of the present invention will become more apparent from the following detailed description taken in conjunction with the accompanying drawings, wherein:

FIGS. 4A and 4B are diagrams for explaining a positional relation between a semiconductor wafer and a quartz inner tube in the vertical-type LPCVD film forming apparatus which uses BTBAS as one of raw gases, wherein

FIGS. 5A and 5B are for explaining a relation between a ratio "b/a", which is a ratio of the distance "b" between the edge of the semiconductor wafer and the inner wall of the reaction tube 12 to the distance "a" between the adjacent semiconductor wafers, and the thickness uniformity of a film over the entire surface of the semiconductor wafer, which film is formed on the semiconductor wafer in the vertical-type LPCVD film forming apparatus which uses BTBAS as one of raw gases, wherein

DESCRIPTION OF THE PREFERRED EMBODIMENTS

Next, one embodiment of the present invention will be explained with reference to the drawings below.

Figure 2:
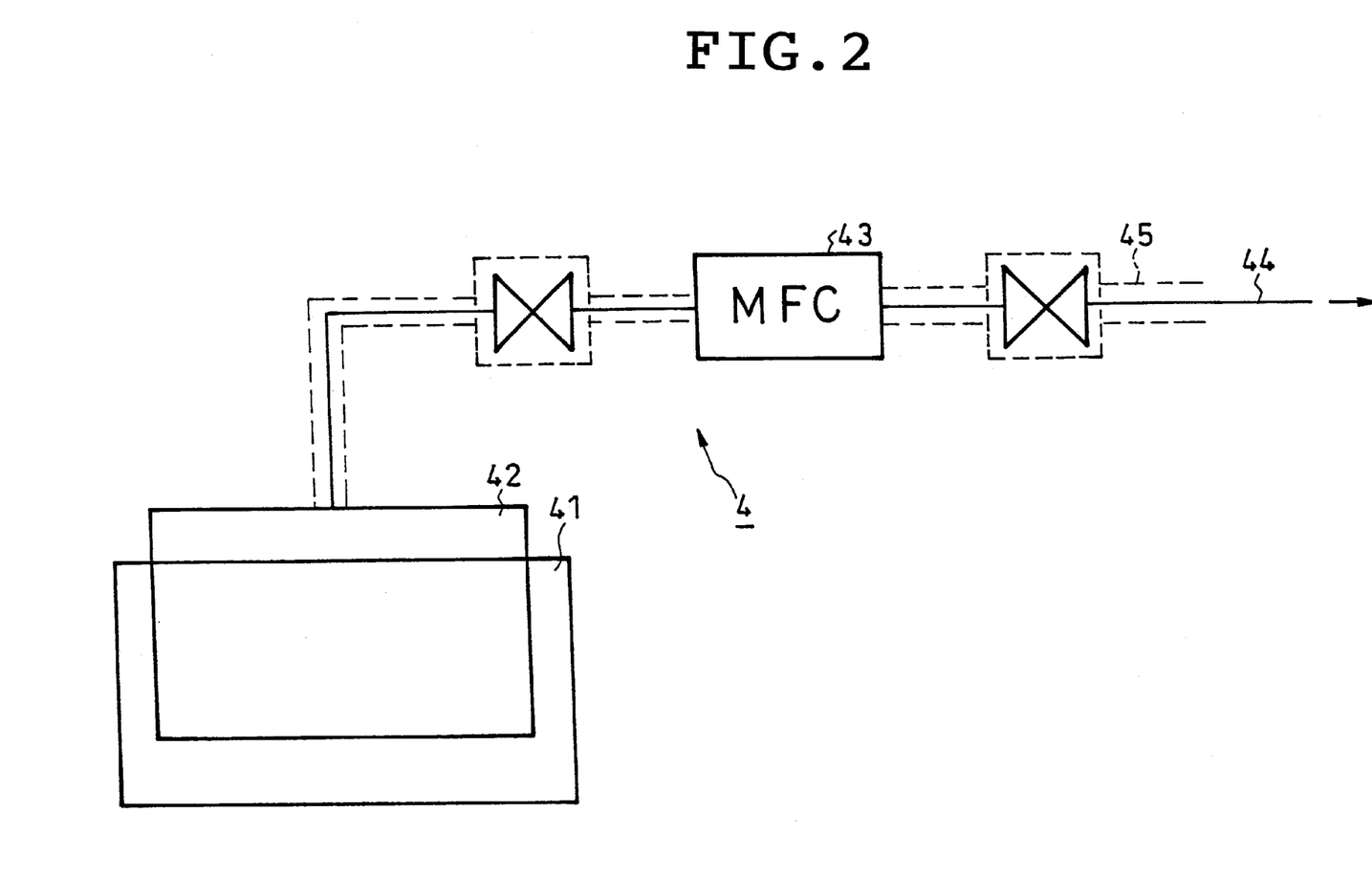
FIG. 2 is a schematic view for explaining one example of a BTBAS supply apparatus preferably used in the film forming apparatus used in the one embodiment of the present invention.
Figure 3:
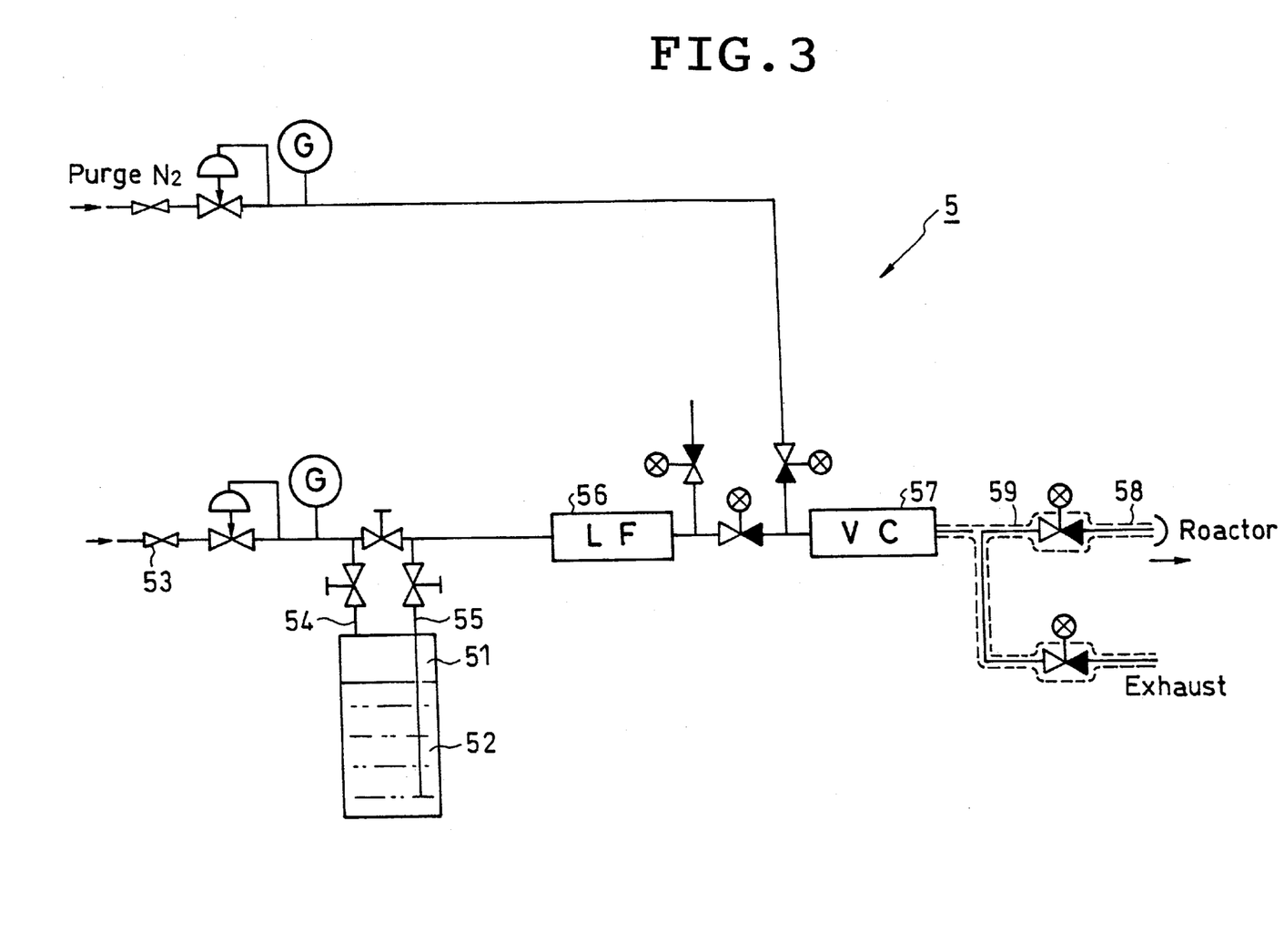
FIG. 3 is a schematic view for explaining another example of a BTBAS supply apparatus preferably used in the film forming apparatus used in the one embodiment of the present invention.

Since BTBAS used in the present invention is in a liquid state at room temperature, the BTBAS is introduced into a furnace using a BTBAS supply apparatus shown in FIGS. 2 and 3.

A BTBAS supply apparatus shown in FIG. 2 is a combination of a thermostatic bath and gas flow rate control. A BTBAS supply apparatus shown in FIG. 3 controls a flow rate by a combination of a liquid flow rate control and a vaporizer.

Referring to FIG. 2, in the BTBAS supply apparatus 4, an interior of a thermostatic bath 41 containing a BTBAS liquid raw material 42 therein is heated to about 100° C. to increase a vapor pressure of BTBAS, thereby evaporating the BTBAS. Then, the evaporated BTBAS is controlled in flow rate by a mass-flow controller 43, and supplied, from a BTBAS supply port 44, to a supply port 22 of a nozzle 21 of an vertical-type LPCVD (low pressure CVD) film forming apparatus shown in FIG. 1. In the BTBAS supply apparatus 4, pipes from the BTBAS liquid raw material 42 to the BTBAS supply port 44 are covered with pipe heating members 45.

Referring to FIG. 3, in the BTBAS supply apparatus 5, push-out gas of He or $N_2$ introduced from a push-out gas introducing port 53 is introduced, through a pipe 54, into a BTBAS tank 51 containing a BTBAS liquid raw material 52 therein, thereby pushing out the BTBAS liquid raw material 52 into a pipe 55. Then, the BTBAS liquid raw material 52 is controlled in flow rate by a liquid flow-rate control apparatus 56 and sent to a vaporizer 57. In the vaporizer 57, the BTBAS liquid raw material 52 is evaporated and supplied, from a BTBAS supply port 58, to the supply port 22 of the nozzle 21 of the vertical-type LPCVD (low pressure CVD) film forming apparatus shown in FIG. 1. In the BTBAS supply apparatus 5, pipes from the vaporizer 57 to the BTBAS supply port 58 are covered with pipe heating members 59.

Next, the vertical-type LPCVD film forming apparatus which can preferably be used in the present embodiment will be explained with reference to FIG. 1.

In the vertical-type LPCVD film forming apparatus 1, a heater 13 is provided outside of a quartz reaction tube 11 so that an interior of the quartz reaction tube 11 can be heated uniformly. A quartz inner tube 12 is provided in the quartz reaction tube 11. A quartz boat 14 is provided in the quartz inner tube 12, and a plurality of semiconductor wafers are mounted on the quartz boat 14 and stacked in the vertical direction. The quartz boat 14 is mounted on a cap 15. The quartz boat 14 is brought into and out from the quartz inner tube 12 by vertically moving the cap 15. Lower portions of the quartz reaction tube 11 and the quartz inner tube 12 are opened, but they are air-tightly closed by a bottom plate 24 of the cap 15 by moving the cap 15 upward. Apparatus nozzles 18 and 21 are provided in lower portions of the quartz inner tube 12 such as to bring into communication with the quartz inner tube 12. An upper portion of the quartz inner tube 12 is opened. A discharge port 17 is provided at a lower portion of space between the quartz inner tube 12 and the quartz reaction tube 11 so as to bring into communication with the space. The discharge port 17 is in communication with a vacuum pump (not shown) so as to evacuate the quartz reaction tube 11. The raw gases supplied from the quartz nozzles 18 and 21 are injected from injection ports 20 and 23 into the quartz inner tube 12. The gases then move in the quartz inner tube 12 from its lower portion to its upper portion, thereafter downwardly flows through the space between the quartz inner tube 12 and the quartz reaction tube 11, and is discharged from the discharge port 17.

A method for forming a silicon nitride film using the vertical-type LPCVD film forming apparatus 1 will be explained next.

First, the quartz boat 14 holding a large number of semiconductor wafers 16 is inserted into the quartz inner tube 12 the inside temperature of which is maintained at 600° C. or lower.

Next, the quartz reaction tube 11 is evacuated from the discharge port 17 to produce a vacuum therein using a vacuum pump (not shown). In order to stabilize a temperature over the entire surface of the wafer, it is preferable to evacuate for about one hour.

Next, $NH_3$ gas is charged from a charging port 19 of the quartz nozzle 18 to purge the inside of the quartz reaction tube 11 using $NH_3$ before BTBAS is charged.

Then, while $NH_3$ gas is continuously charged from a charging port 19 of the quartz nozzle 18, BTBAS is charged from the charging port 22 of the quartz nozzle 21, and an $Si_3N_4$ film is formed on the semiconductor wafer 16.

Next, the supply of BTBAS is stopped while keep charging the $NH_3$ gas from the charging port 19 of the quartz nozzle 18, thereby purging the quartz reaction tube 11 using $NH_3$.

If only BTBAS is charged, a film different from the $Si_3N_4$ film is formed and thus, it is preferable to purge the quartz reaction tube 11 using $NH_3$ before and after deposition.

Next, $N_2$ is allowed to flow into the quartz reaction tube 11 from the quartz nozzle 18 to purge the quartz reaction tube 11 using $N_2$, thereby removing $NH_3$ in the quartz reaction tube 11.

Then, the supply of $N_2$ is stopped and the quartz reaction tube 11 is evacuated to produce a vacuum therein. A set of the purge operation using $N_2$ and the subsequent evacuation operation in the quartz reaction tube 11 is carried out several times.

Thereafter, the interior of the quartz reaction tube 11 is brought back from the vacuum state into the atmospheric pressure state. Then, the quartz boat 14 is moved down and taken out from the quartz reaction tube 11. Then, the quartz boat 14 and the semiconductor wafers 16 are cooled down to room temperature.

The above is described for forming a silicon nitride film, the above, however, also holds true for forming a silicon oxynitride film except that $NH_3$ gas and $N_2O$ gas are charged from the charging port 19 of the quartz nozzle 18.

Figure 5A:
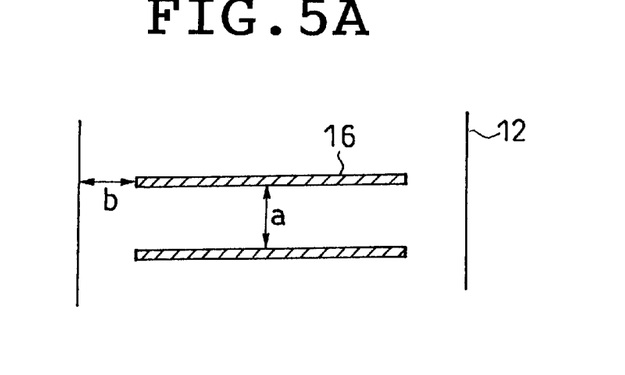
FIG. 5A is a schematic longitudinal sectional view for explaining the distance "a" and the distance "b"
Figure 5B:
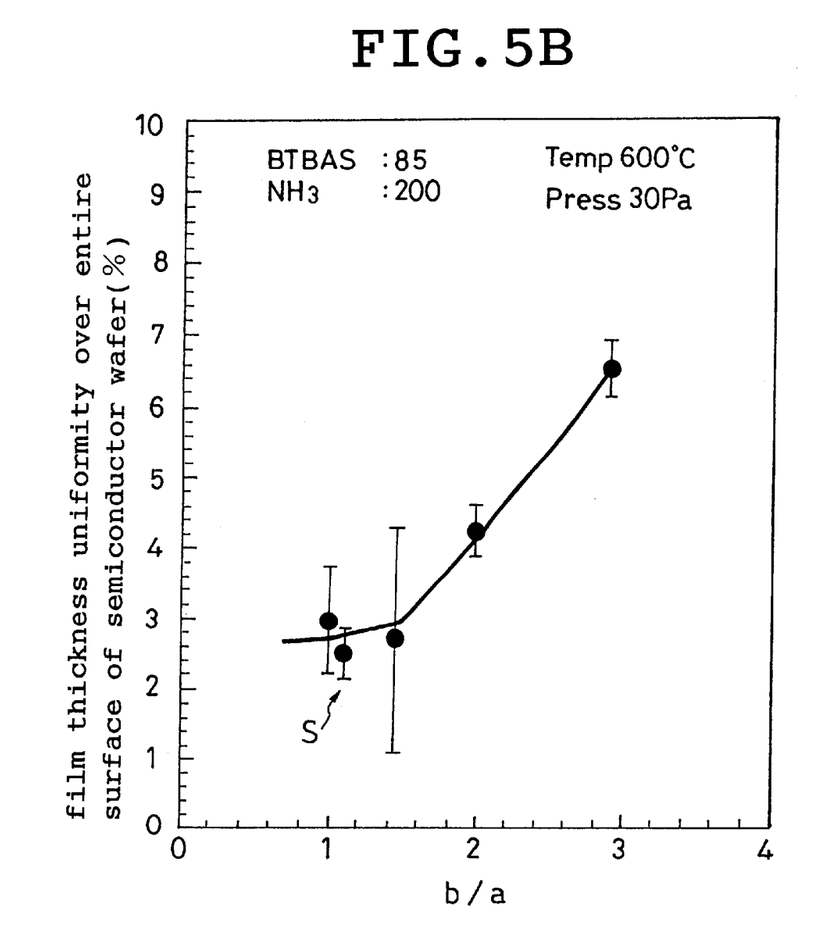
FIG. 5B is a diagram showing a relation between "b/a" and thickness uniformity of the film over the entire surface of the semiconductor wafer.

In a situation in which a silicon nitride film is formed using BTBAS and $NH_3$ as raw gases using the above-described vertical-type LPCVD film forming apparatus 1, a relation between thickness distribution, over the entire surface of the semiconductor wafer 16, of a silicon nitride film formed on the semiconductor wafer 16 and a ratio "b/a", which is a ratio of a distance "b" between an edge of the semiconductor wafer 16 and an inner wall of the quartz inner tube 12 to a distance "a" between the adjacent semiconductor wafers 16 was examined while changing the distance "a" between the adjacent semiconductor wafers 16 without changing the quartz inner tube 12. A result thereof is shown in FIG. 5B. Conditions under which the data was obtained were that a film formation temperature was 600° C., a pressure was 30 Pa, a flow rate of BTBAS was 85 sccm, and a flow rate of $NH_3$ was 200 sccm. In this graph, black circles indicate the average value of the thickness uniformities, over each entire surface of the semiconductor wafers, of the films respectively formed on three semiconductor wafers, i.e., top, middle and bottom semiconductor wafers, and vertically extending lines indicate differences between the best and the worst points of film thickness uniformities over each entire surface of the three semiconductor wafers, i.e., top, middle and bottom semiconductor wafers. Here, the top semiconductor wafer means a semiconductor wafer located at 6 to 7% of all the stacked semiconductor wafers from the top, the middle semiconductor wafer means a semiconductor wafer located at middle portion, and the bottom semiconductor wafer means a semiconductor wafer located at 6 to 7% of all the stacked semiconductor wafers from the bottom. Values of the black circles in FIG. 5B are 0.96, 1.10, 1.44, 1.92 and 2.88 from the left.

It can be found that when "b/a" approaches 1, the film thickness distribution becomes excellent. It is preferable to form a film under a condition that "b/a" is between 0.5 and 1.1. If "b/a" is greater than 1.1, the thickness uniformity of the film over the entire surface of the semiconductor wafer is inferior, or variation in film thickness uniformity among films respectively formed on the top, middle and bottom semiconductor wafers becomes large. If "b/a" is smaller than 0.5, it is difficult to insert the semiconductor wafers into the reaction tube. It is further preferable to form a film under a condition that "b/a" is between 0.96 and 1.10.

In order to bring "b/a" close to 1 without changing the quartz inner tube, the distance "a" between the adjacent semiconductor wafers must be increased. If the distance "a" is increased, the number of semiconductor wafers to be processed at one time processing is reduced, and this is not preferable in terms of throughput.

In order to brig "b/a" close to 1, it is preferable to narrow the distance between the semiconductor wafer 16 and the quartz inner tube 12.

Since the distance between the semiconductor wafers 16 is 6.35 mm, 6 to 7 mm is appropriate as the distance between the wafer 16 and the inner tube 12.

Therefore, the optimal inner diameter of the quartz inner tube 12 with respect to the wafer 16 having a diameter of 200 mm is 214 mm.

It can be found that the film thickness distribution when the quartz inner tube 12 is used is within 3% as shown with S in FIG. 5B, and the distribution is improved as compared with 6% in the conventional technique. Since the distance between the semiconductor wafers 16 is not changed, the number of wafers which can be processed at a time is the same as that of the conventional technique.

Figure 6:
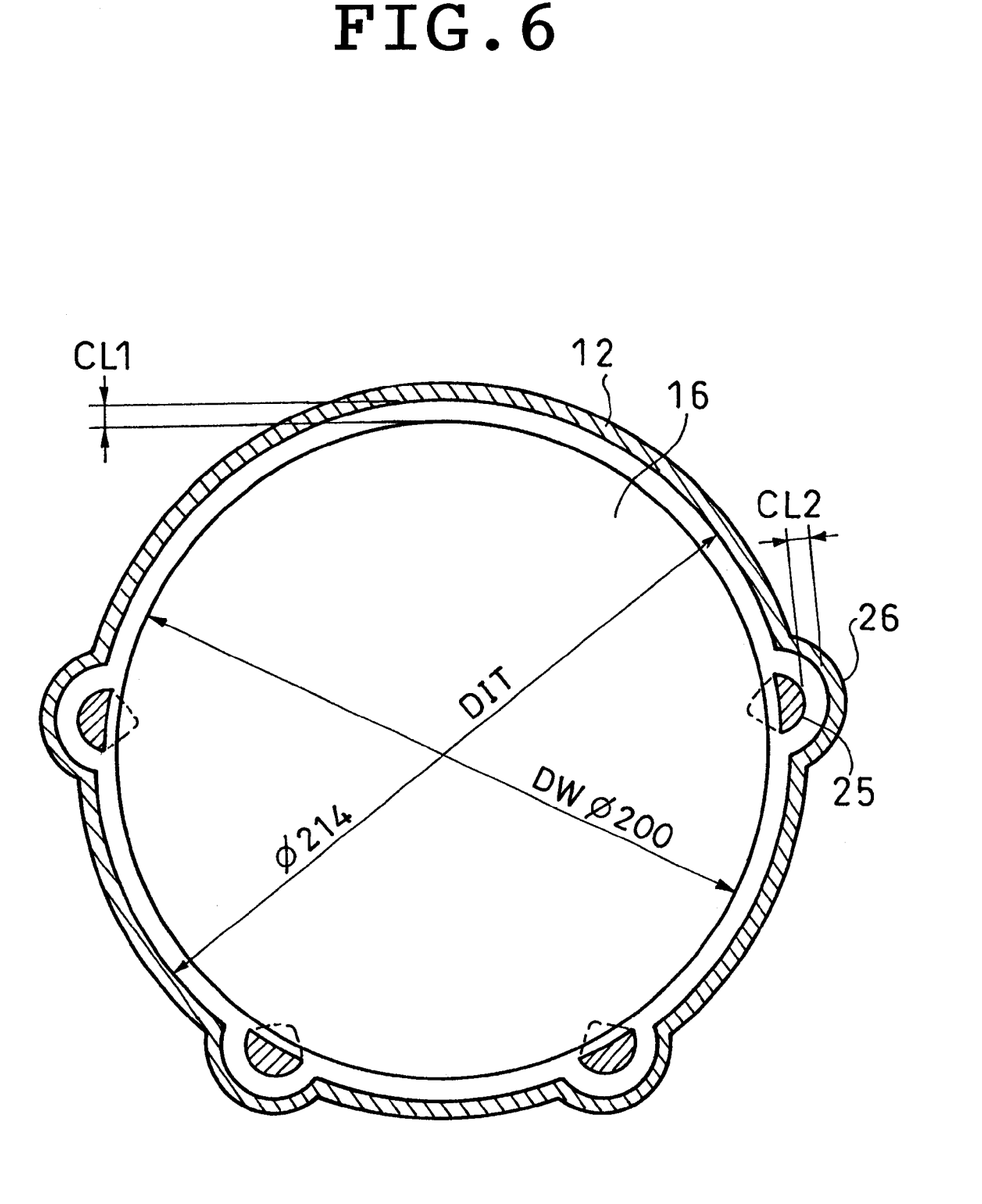
FIG. 6 is a transverse sectional view for explaining a preferred positional relation between the inner tube, boat columns and the semiconductor wafers in the vertical-type LPCVD film forming apparatus which uses BTBAS as one of raw gases.

As shown in FIG. 6, the boat for supporting the semiconductor wafers 16 is provided with the boat columns 25 which are located at outer side of the wafers 16. Therefore, the boat can not be inserted into the cylindrical quartz inner tube 12 having the inner diameter of 214 mm. Thus, used is the quartz inner tube 12 provided, at portions corresponding to the boat columns 25, with boat column grooves 26 which are spaces into which the boat columns 25 are retreated.

The above-described result was obtained when the silicon nitride film is formed using BTBAS and $NH_3$ as raw gases, and the almost same result was also obtained when a silicon oxynitride film is formed using BTBAS, $NH_3$ and $N_2O$ as raw gases.

Processing conditions at that time were that a film formation temperature was 595° C., a pressure was 65 Pa, a flow rate of BTBAS was 100 sccm, a flow rate of $NH_3$ was 400 sccm and a flow rate of $N_2O$ was 200 sccm.

According to the present invention, when a silicon nitride film is formed using BTBAS and $NH_3$ as raw gases, or when a silicon oxynitride film is formed using BTBAS, $NH_3$ and $N_2O$ as raw gases, uniformity in thickness of the formed film over the entire surface of the substrate wafer can be enhanced.

The entire disclosure of Japanese Patent Application No. 2000-37120 filed on Feb. 15, 2000 including specification, claims, drawings and summary are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A semiconductor device manufacturing method, comprising:
   a step of forming, by thermal chemical vapor deposition, silicon nitride films on a plurality of substrates vertically stacked in a vertical reaction tube having an inner wall, with bis tertiary butyl amino silane and $NH_3$ flowing into said vertical reaction tube and flowing vertically from one end of said plurality of substrates to an opposing end of said plurality of substrates and not flowing into said vertical reaction tube through said inner wall at a height between said one end and said opposing end of said plurality of substrates, wherein said silicon nitride films are formed on said plurality of substrates in a state in which a distance "a" between adjacent substrates of said plurality of substrates and a distance "b" between edges of said plurality of substrates and said inner wall of said vertical reaction tube are maintained substantially equal to each other.

2. The semiconductor device manufacturing method according to claim 1, wherein a value of a ratio "b/a", which is a ratio of said distance "b" between said edges of said plurality of substrates and said inner wall of said vertical reaction tube to said distance "a" between said adjacent substrates, is set to be in a range of 0.5 to 1.1, and said silicon nitride films are formed on said plurality of substrates in this state.

3. A semiconductor device manufacturing method, comprising:
   a step of forming, by thermal chemical vapor deposition, silicon oxynitride films on a plurality of substrates vertically stacked in a vertical reaction tube having an inner wall, with bis tertiary butyl amino silane, $NH_3$ and $N_2O$ flowing into said vertical reaction tube and flowing from one end of said plurality of substrates to an opposing end of said plurality of substrates and not flowing into said vertical reaction tube through said inner wall at a height between said one end and said opposing end of said plurality of substrates, wherein said silicon oxynitride films are formed on said plurality of substrates in a state in which a distance "a" between adjacent substrates of said plurality of substrates and a distance "b" between edges of said plurality of substrates and said inner wall of said vertical reaction tube are maintained substantially equal to each other.

4. The semiconductor device manufacturing method according to claim 3, wherein a value of a ratio "b/a", which is a ratio of said distance "b" between said edges of said plurality of substrates and said inner wall of said vertical reaction tube to said distance "a" between said adjacent substrates, is set to be in a range of 0.5 to 1.1, and said silicon oxynitride films are formed on said plurality of substrates in this state.

5. The semiconductor device manufacturing method according to 1, wherein said silicon nitride films are formed on said plurality of substrates, with bis tertiary butyl amino silane and $NH_3$ flowing into said vertical reaction tube from underneath said plurality of substrates and then upward within said vertical reaction tube above said plurality of substrates.

6. The semiconductor device manufacturing method according to 3, wherein said silicon oxynitride films are formed on said plurality of substrates, with bis tertiary butyl amino silane, $NH_3$, and $N_2O$ flowing into said vertical reaction tube from underneath said plurality of substrates and then upward within said vertical reaction tube above said plurality of substrates.

7. A semiconductor device manufacturing method comprising:
   a step of forming, by thermal chemical vapor deposition, silicon nitride films on a plurality of substrates stacked on a boat having a boat column with bis tertiary butyl amino silane and $NH_3$ flowing into a reaction tube accommodating said plurality of substrates, wherein said reaction tube is provided, at a position corresponding to said boat column, with a boat column groove for accepting said boat column; and wherein said silicon nitride films are formed on said plurality of substrates in a state in which a distance "a" between adjacent substrates of said plurality of substrates and a distance "b" between edges of said plurality of substrates and an inner wall of said reaction tube are maintained substantially equal to each other.

8. The semiconductor device manufacturing method according to claim 7, wherein said plurality of substrates are vertically stacked on said boat and said reaction tube is a vertical reaction tube having an inner wall.

9. The semiconductor device manufacturing method according to claim 8, wherein said bis tertiary butyl amino silane and said $NH_3$ flow into said vertical reaction tube and flow vertically from one end of said plurality of substrates to an opposing end of said plurality of substrates and do not flow into said vertical reaction tube through said inner wall at a height between said one end and said opposing end of said plurality of substrates.

10. The semiconductor device manufacturing method according to claim 7, wherein a value of a ratio "b/a", which is a ratio of said distance "b" between said edges of said plurality of substrates and said inner wall of said reaction tube to said distance "a" between said adjacent substrates, is set to be in a range of 0.5 to 1.1, and said silicon nitride films are formed on said plurality of substrates in this state.

11. The semiconductor device manufacturing method according to 8, wherein said silicon nitride films are formed on said plurality of substrates, with bis tertiary butyl amino silane and $NH_3$ flowing into said vertical reaction tube from underneath said plurality of substrates and then upward within said vertical reaction tube above said plurality of substrates.

12. The semiconductor device manufacturing method according to claim 7, wherein said boat includes more than one boat column and said reaction tube includes a corresponding number of boat column grooves.

13. A semiconductor device manufacturing method comprising:

a step of forming, by thermal chemical vapor deposition, silicon oxynitride films on a plurality of substrates stacked on a boat having a boat column with bis tertiary butyl amino silane, $NH_3$, and $N_2O$ flowing into a reaction tube accommodating said plurality of substrates, wherein said reaction tube is provided, at a position corresponding to said boat column, with a boat column groove for accepting said boat column; and wherein said silicon oxynitride films are formed on said plurality of substrates in a state in which a distance "a" between adjacent substrates of said plurality of substrates and a distance "b" between edges of said plurality of substrates and an inner wall of said reaction tube are maintained substantially equal to each other.

14. The semiconductor device manufacturing method according to claim 13, wherein said plurality of substrates are vertically stacked on said boat and said, reaction tube is a vertical reaction tube having an inner wall.

15. The semiconductor device manufacturing method according to claim 14, wherein said bis tertiary butyl amino silane, said $NH_3$, and said $N_2O$ flow into said vertical reaction tube and flow vertically from one end of said plurality of substrates to an opposing end of said plurality of substrates and do not flow into said vertical reaction tube through said inner wall at a height between said one end and said opposing end of said plurality of substrates.

16. The semiconductor device manufacturing method according to claim 13, wherein a value of a ratio "b/a", which is a ratio of said distance "b" between said edges of said plurality of substrates and said inner wall of said reaction tube to said distance "a" between said adjacent substrates, is set to be in a range of 0.5 to 1.1, and said silicon oxynitride films are formed on said plurality of substrates in this state.

17. The semiconductor device manufacturing method according to 14, wherein said silicon oxynitride films are formed on said plurality of substrates, with bis tertiary butyl amino silane, $NH_3$, and $N_2O$ flowing into said vertical reaction tube from underneath said plurality of substrates and then upward within said vertical reaction tube above said plurality of substrates.

18. The semiconductor device manufacturing method according to claim 13, wherein said boat includes more than one boat column and said reaction tube includes a corresponding number of boat column grooves.

* * * * *